(12) United States Patent
Toprac et al.

(10) Patent No.: US 6,409,879 B1
(45) Date of Patent: Jun. 25, 2002

(54) SYSTEM FOR CONTROLLING TRANSISTOR SPACER WIDTH

(75) Inventors: Anthony J. Toprac; John R. Behnke; Matthew Purdy, all of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 85 days.

(21) Appl. No.: 09/602,045

(22) Filed: Jun. 23, 2000

Related U.S. Application Data

(62) Division of application No. 09/488,605, filed on Jan. 20, 2000.

(51) Int. Cl.[7] .............................. C23F 1/02; C23C 16/00
(52) U.S. Cl. ................. 156/345.24; 118/663; 118/695; 118/696; 118/698; 118/699; 118/719
(58) Field of Search ..................... 216/59, 60; 156/345, 156/345.24, 345.31, 345.32; 118/6, 719, 663, 695–699; 438/595, 7, 10, 692, 710, 714; 427/255.29, 8, 9, 10, 255.37, 563, 579, 578, 569

(56) References Cited

U.S. PATENT DOCUMENTS

| | | | | |
|---|---|---|---|---|
| 4,789,426 A | * | 12/1988 | Pipkin ........................ | 438/714 |
| 5,291,415 A | * | 3/1994 | Zarowin et al. ......... | 364/474.3 |
| 5,387,311 A | * | 2/1995 | Hall et al. .................... | 437/44 |
| 5,474,647 A | * | 12/1995 | Poultney et al. ............... | 438/5 |
| 5,510,281 A | * | 4/1996 | Ghezzo et al. ............... | 438/268 |
| 5,656,533 A | * | 8/1997 | Kim ........................... | 438/396 |
| 5,814,563 A | * | 9/1998 | Ding et al. ................. | 438/714 |
| 5,833,817 A | * | 11/1998 | Tsai et al. ............. | 204/192.17 |
| 5,856,224 A | * | 1/1999 | Sheu .......................... | 438/266 |
| 5,863,824 A | * | 1/1999 | Gardner et al. ............. | 438/303 |
| 6,133,132 A | * | 10/2000 | Toprac et al. ............... | 438/595 |

FOREIGN PATENT DOCUMENTS

| | | | |
|---|---|---|---|
| JP | 02003243 | * | 1/1990 |
| JP | 07176729 | * | 7/1995 |

* cited by examiner

Primary Examiner—Jeffrie R. Lund
(74) Attorney, Agent, or Firm—Williams, Morgan & Amerson, P.C.

(57) ABSTRACT

A method for controlling spacer width in a semiconductor device is provided. A substrate having a gate formed thereon is provided. An insulative layer is formed over at least a portion of the substrate. The insulative layer covers the gate. The thickness of the insulative layer is measured. A portion of the insulative layer to be removed is determined based on the measured thickness of the insulative layer. The portion of the insulative layer is removed to define a spacer on the gate. A processing line for forming a spacer on a gate disposed on a substrate includes a deposition tool, a thickness metrology tool, and automatic process controller, and a spacer etch tool. The deposition tool is adapted to form an insulative layer over at least a portion of the substrate. The insulative layer covers the gate. The thickness metrology tool is adapted to measure the thickness of the insulative layer. The automatic process controller is adapted to determine a portion of the insulative layer to be removed based on the measured thickness of the insulative layer. The spacer etch tool is adapted to remove the portion of the insulative layer to define a spacer on the gate.

11 Claims, 3 Drawing Sheets

SYSTEM FOR CONTROLLING TRANSISTOR SPACER WIDTH

This is a divisional of co-pending application Ser. No. 09/488,605, filed Jan. 20, 2000.

BACKGROUND OF THE INVENTION

1. Field of the Invention

This invention relates generally to the field of semiconductor processing, and, more particularly, to a method for reducing junction capacitance using a halo implant photomask.

2. Description of the Related Art

Semiconductor devices, such as transistors, are formed through a series of steps. First a gate is formed over a portion of a substrate. Various implants are then conducted to form source/drain (S/D) regions of the transistor. In an N type transistor, N type dopants are implanted in a P type substrate. In a P type transistor, an N type well is typically formed in a portion of the substrate, and the gate is formed over a portion of the N type well. P type dopants are then implanted to form the S/D regions.

Typically, several implantation steps are used to form the transistor. In the following discussion, fabrication of an N type transistor is described. First, a lightly doped drain (LDD) implant is performed using an N type dopant, such as arsenic. Next, a halo implant is performed using a P type dopant, such as boron. The halo implant is used to reduce short channel effects associated with the transistor. Short channel effects cause the threshold voltage of the transistor to decrease as the geometry shrinks. Typically, at least a portion of the halo implant is performed at an angle so that some of the dopant is implanted beneath the gate. Following the halo implant, spacers are formed on the gate, and a S/D implant is performed with an N type dopant, such as phosphorous.

The spacers are typically formed by depositing a conformal insulative layer over the gate and surrounding substrate and anisotropically etching the conformal insulative layer. Because the spacer etch is anisotropic, the portions of the insulative layer on the sides of the gate are not removed, thus leaving the spacer. The endpoint for stopping the spacer etch is typically determined by monitoring (e.g., by optical emission spectroscopy) the makeup of the plasma used to perform the etch. When the substrate is exposed during the etch, the makeup of the plasma changes. This change is detected and the etch is stopped. Due to variations in the initial thickness of the insulative layer, the conformality of the insulative layer, and the accuracy of the endpointing process, the final width of the spacers formed is not always constant.

The effective channel length $L_{eff}$ of the resulting gate depends a great deal on the width of the spacers, because the source/drain implant is performed after their formation. The effective channel length is an influential factor in determining the maximum speed of the transistors, and thus, the overall speed rating of the device (e.g., microprocessor). Lack of effective spacer width control widens the speed distributions of the devices produced. Faster devices have a higher market value; hence, wider speed variations equate to reduced revenue.

The present invention is directed to overcoming, or at least reducing the effects of, one or more of the problems set forth above.

SUMMARY OF THE INVENTION

One aspect of the present invention is seen in a method for controlling spacer width in a semiconductor device. A substrate having a gate formed thereon is provided. An insulative layer is formed over at least a portion of the substrate. The insulative layer covers the gate. The thickness of the insulative layer is measured. A portion of the insulative layer to be removed is determined based on the measured thickness of the insulative layer. The portion of the insulative layer is removed to define a spacer on the gate.

Another aspect of the present invention is seen in a processing line for forming a spacer on a gate disposed on a substrate. The processing line includes a deposition tool, a thickness metrology tool, and automatic process controller, and a spacer etch tool. The deposition tool is adapted to form an insulative layer over at least a portion of the substrate. The insulative layer covers the gate. The thickness metrology tool is adapted to measure the thickness of the insulative layer. The automatic process controller is adapted to determine a portion of the insulative layer to be removed based on the measured thickness of the insulative layer. The spacer etch tool is adapted to remove the portion of the insulative layer to define a spacer on the gate.

BRIEF DESCRIPTION OF THE DRAWINGS

The invention may be understood by reference to the following description taken in conjunction with the accompanying drawings, in which like reference numerals identify like elements, and in which.

Figure 1:
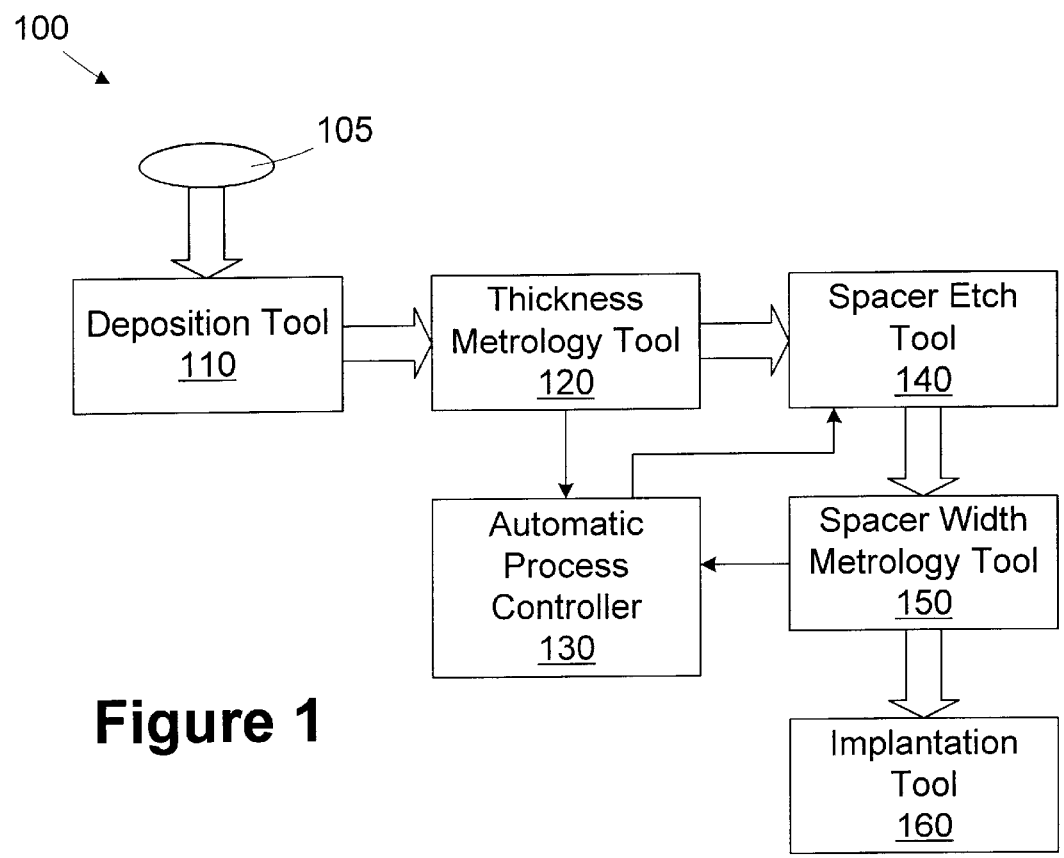
FIG. 1 is a simplified block diagram of an illustrative processing line for forming spacers in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the Figures, and particularly to FIG. 1, a simplified block diagram of a processing line 100 useful for forming spacers a semiconductor device is provided. The processing line processes a plurality of wafers 105, either in lots or individually. The operation of the processing line 100 of FIG. 1 is described in reference to the cross-section views of the wafer 105 provided in FIGS. 2 through 4.

Figure 2:
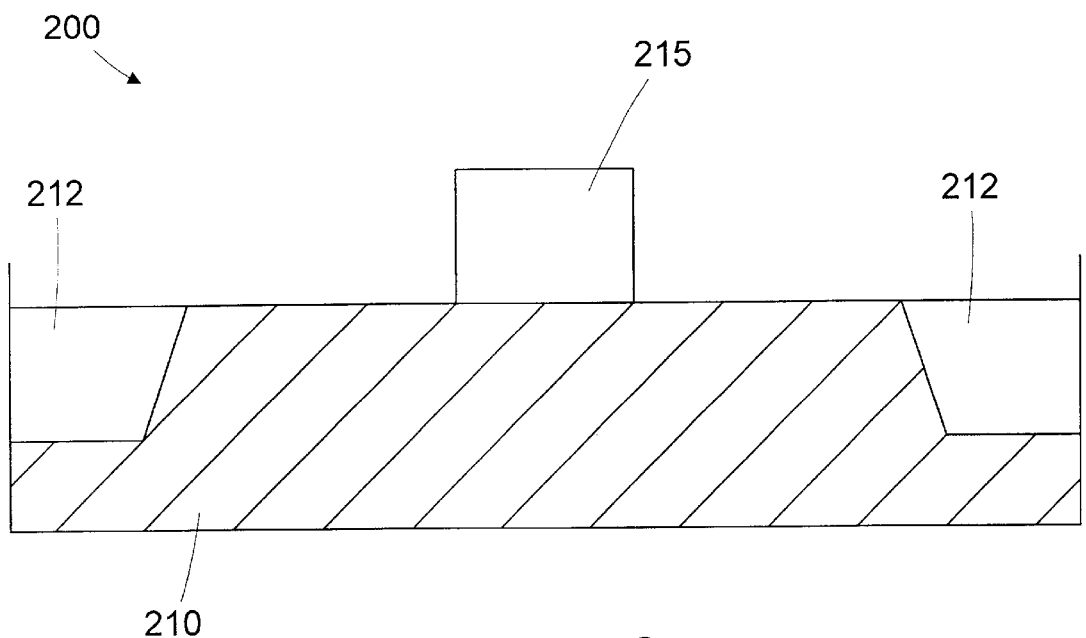
FIG. 2 is a cross section view of a partially completed semiconductor device in accordance with the present invention.

As seen in FIG. 2, a cross section view of a partially completed semiconductor device 200 including a substrate 210 (e.g., silicon) is provided. A gate 215 is formed on the substrate 210 between adjacent isolation structures 212 (e.g., shallow trench isolation structures). For clarity and ease of illustration, not all features of the gate 215 are shown. Typically, the gate 215 includes a gate oxide layer formed over the substrate 210, a conductive layer over the gate oxide, and an insulative layer over the conductive layer. The conductive and insulative layers may each include more than one layer. For example, the conductive layer may include a polysilicon layer covered by a silicide layer, and the insulative layer may include an oxide layer covered by a nitride cap layer. Various gate 215 embodiments may be used, and their specific constructs are well known to those of ordinary skill in the art. Thus, the particular structure of the gate 215 should not be considered a limitation of the present invention.

Figure 3:
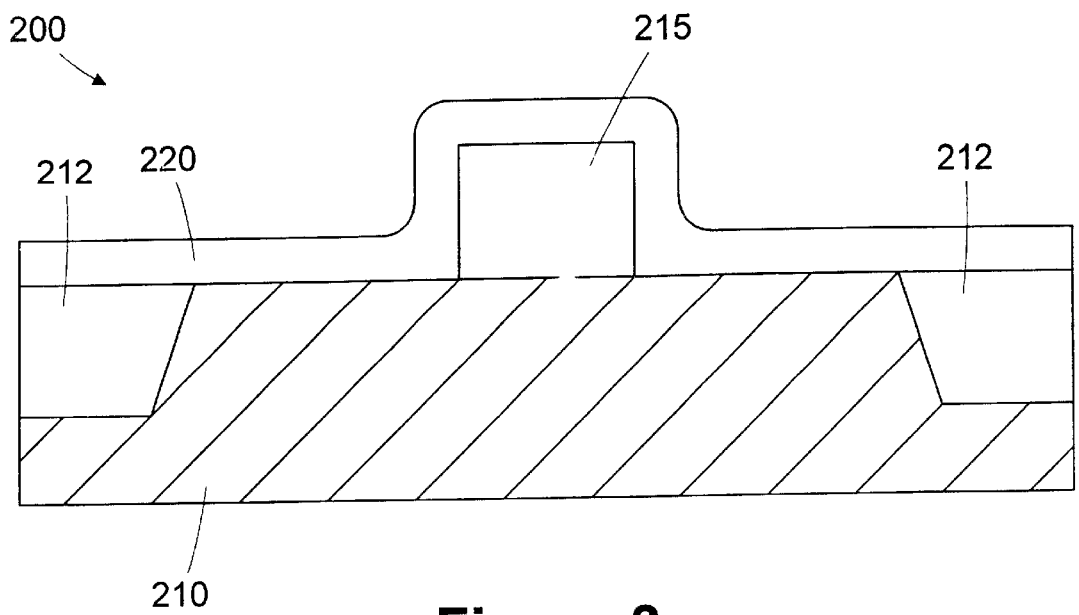
FIG. 3 is a cross section view of the device of FIG. 2 after an insulative layer has been formed over a gate.

Referring now to both FIG. 1 and FIG. 3, an insulative layer 220 (e.g., silicon nitride or silicon dioxide) is formed over the substrate 210 and gate 215 by, for example, a deposition tool 110 using processing techniques well known to those of ordinary skill in the art. An exemplary device suitable for forming the insulative layer 220 is a Concept 2 plasma enhanced chemical vapor deposition tool offered by Novellus Systems, Inc. There are normal variations in the thickness of the insulative layer 220 caused by factors in the deposition tool 110, such as deposition time, temperature, and other deposition parameters.

The thickness of the insulative layer 220 is measured by a thickness metrology tool 120. Depending on the specific application, the thickness metrology tool 120 may measure the thickness of the insulative layer 220 on one wafer 105 in a lot, or on each individual wafer 105. Other measurement frequencies may also be used. An exemplary tool suitable for measuring the thickness of the insulative layer 220 is an Opti-Probe offered by ThermaWave, Inc.

The insulative layer 220 thickness measurement is passed to an automatic process controller 130. The automatic process controller 130 may comprise a general computer executing software, a dedicated hardware device, or some other combination of hardware, software, firmware, etc. The automatic process controller 130 may communicate with other devices in the processing line 100 over a communication bus (not shown) such as a computer network (not shown).

Figure 4:
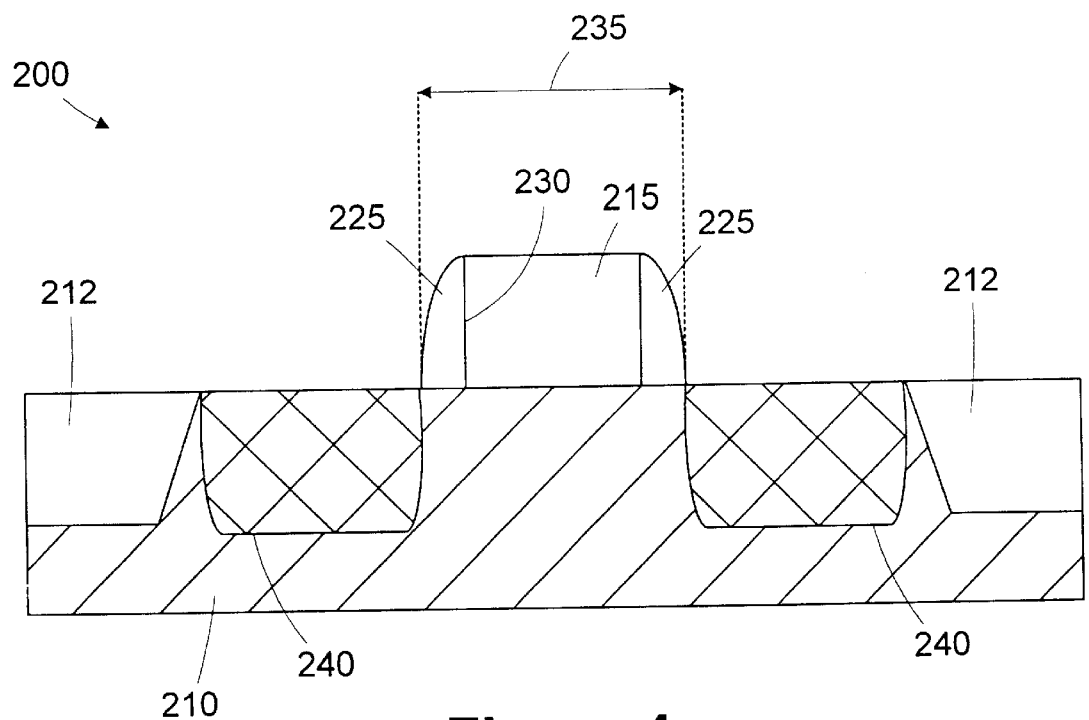
FIG. 4 is a cross section view of the device of FIG. 3 after the insulative layer has been etched to form spacers about the gate and a source/drain implant has been performed.

Turning to FIGS. 1 and 4, a spacer etch tool 140 removes a portion of the insulative layer 220 to define spacers 225 around the sides 230 of the gate. The etch process used by the spacer etch tool 140 is an anisotropic plasma etch well known to those of ordinary skill in the art. A suitable tool for performing the spacer etch is a LAM 4500 offered by Lam Research Corporation. Prior to the spacer etch, the automatic process controller 130 modifies the operating recipe of the spacer etch tool 140 based on the insulative layer 220 thickness measurement in accordance with predetermined control equations to affect the width of spacers 225. In the illustrated embodiment, the automatic process controller 130 controls the spacer width by modifying the etch time of the spacer etch tool 140 based on the insulative layer 220 thickness measurement and a target value for the resulting spacer width. However, the application of the present invention is not so limited as other operating parameters of the spacer etch tool 140 may be modified to control the final spacer width.

Control equations for modifying the operating recipe of the spacer etch tool 140 to control the width of the spacers 225 may be linear equations with or without feedback components. Alternatively, the control equations may be implemented using a more elaborate model, such as non-linear equations, a neural network, or a principal components analysis model. Development and use of these types of control models are well known to those of ordinary skill in the art.

The etch time parameter controlled by the automatic process controller 130 may be a fixed time period in lieu of the traditional optical emission spectroscopy (OES) endpoint detection, or alternatively, the automatic process controller 130 may specify a variable overetch time after the traditional endpoint has been reached. In the first embodiment, the automatic process controller 130 selects an etch time based on the control model and the target spacer width. The OES measurement is not used. In the second embodiment, the OES sensor (not shown), which is typically integrated into the spacer etch tool 140, signals a preliminary endpoint detection. The automatic process controller 130 specifies a time period for continued etching after the preliminary endpoint is signaled. The amount of overetch time specified by the automatic process controller 130 is determined based on the insulative layer 220 thickness measurement and the control model. The preliminary endpoint setting may be adjusted to signal the endpoint slightly sooner than the typical endpoint (i.e., which typically already includes some amount of overetch).

A spacer width metrology tool 150 (e.g., a KLA 8100 scanning electron microscope offered by KLA-Tencor Corporation or an Opal 7830 offered by Applied Materials, Inc.) measures the width of the spacers 225 formed by the spacer etch tool 140 and provides the spacer width measurement to the automatic process controller 130. The automatic process controller 130 may then update the control model used to control the etch time of the spacer etch tool 140 based on the actual spacer width measurement. In the illustrated embodiment, the spacer width metrology tool 150 measures the distance between spacer edges, as indicated by the line 235 in FIG. 4. This measurement is normally taken at the point where the base of the spacer 225 intersects the substrate 210, although measurements of the width of the spacers 225 may be taken at other locations, if desired. Alternatively, the width of only one of the spacers 225 may be used as the spacer width measurement. The feedback measurements taken by the spacer width metrology tool 150 may be performed on every wafer 105, one wafer 105 per lot, or at some other frequency.

As is also seen in FIGS. 1 and 4, an implantation tool 160 implants the substrate with a dopant to form source/drain regions 240. The distance of the source/drain regions 240 from the gate 215, which also defines the effective channel length of the transistor, is dependent on the width of the spacers 225.

In one illustrative embodiment, the automatic process controller 130 may be a standalone controller or it may be one or more of the controllers already resident on any or all of the metrology tools 120, 150 and the spacer etch tool 140. The automatic process controller 130 may reside on a single computer or, alternatively, it may comprise multiple computers distributed throughout the system to perform various parts of the functions attributed to the automatic process controller 130. An exemplary software system capable of being adapted to perform the functions described is the ObjectSpace Catalyst system offered by ObjectSpace, Inc. The ObjectSpace Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699— Provisional Specification for CIM Framework Domain Architecture) and APC (SEMI E93-0999— Provisional Specification for CIM Framework Advanced Process Control Component) specifications are publicly available from SEMI.

Figure 5:
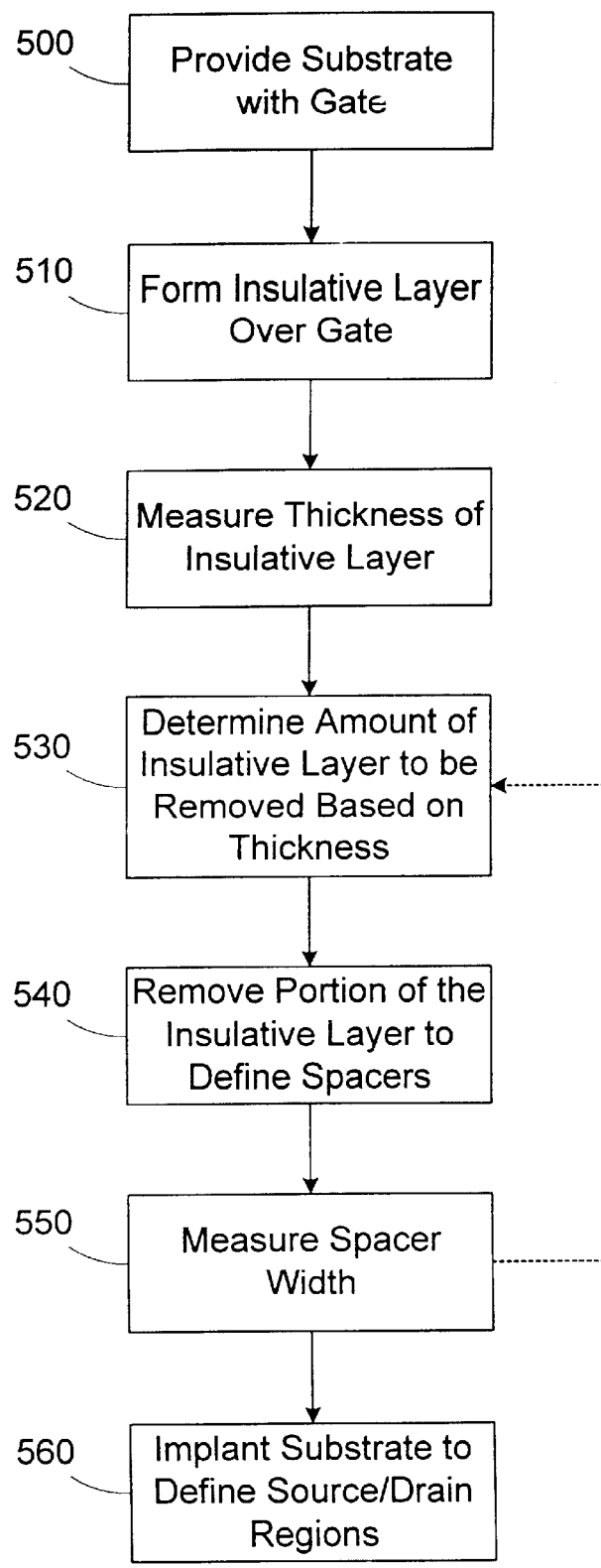
FIG. 5 is a flow diagram of a method for controlling spacer width in accordance with one illustrative embodiment of the present invention.

Turning now to FIG. 5, a simplified flow diagram of one illustrative method for controlling spacer width in accordance with the present invention is provided. In block 500, a semiconductor substrate including a gate formed thereon is provided. A insulative layer is formed over at least a portion of the substrate covering the gate in block 510. The thickness of the insulative layer is measured in block 520. In block 530, an amount of the insulative layer to be removed is determined based on the measured thickness of the insulative layer and the spacer width target value. A portion of the insulative layer is removed in block 540 to define a spacer about the gate. Optionally, the width of the spacer is measured in block 550. The measured spacer width may be used in subsequent iterations of the method in determining the amount of the insulative layer to be removed based on the thickness of the insulative layer performed in block 530. In particular, the measured spacer width can be used to update a control model that relates etch time in the etch chamber used to control the spacer width thickness given the thickness of the insulative layer on the wafer. This control model may then be used to predict the etch time needed in the etch chamber for the next lot of wafers, given its particular insulative layer thickness and target spacer width. An implantation is performed in block 560 to define a source/drain region on the substrate.

Adaptively changing the operating recipes of the spacer etch tool 140, as described above, allows normal variations in the thickness of the insulative layer to be accounted for in subsequent processing runs. Such an adaptive approach reduces variation in the spacer widths, and thus the effective channel lengths of the transistors so produced. The reduced variation leads to greater yields of faster devices and an accompanying increase in the value of such devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processing line for forming a spacer on a gate disposed on a substrate, comprising:
    a deposition tool adapted to form an insulative layer over at least a portion of the substrate, the insulative layer covering the gate;
    a thickness metrology tool adapted to measure the thickness of the insulative layer;
    an automatic process controller adapted to determine an operating recipe parameter for a subsequent etch process to remove a portion of the insulative layer to form the spacer based on the measured thickness of the insulative layer; and
    a spacer etch tool adapted to remove the portion of the insulative layer to define the spacer on the gate in accordance with the determined operating receipt parameter.

2. The processing line of claim 1, further comprising a spacer width metrology tool adapted to measure the width of the spacer.

3. The processing line of claim 2, wherein the automatic process controller is adapted to determine an operating recipe parameter for a subsequent insulative layer based on the measured thickness of the subsequent insulative layer and the measured width of the spacer.

4. The processing line of claim 1, further comprising an implantation tool adapted to implant the substrate proximate the spacer to define a source/drain region, the proximity of the source/drain region to the gate depending on the width of the spacer.

5. The processing line of claim 1, wherein the automatic process controller is adapted to determine an etch time based on the measured thickness of the insulative layer.

6. The processing of claim 5, wherein the automatic process controller is adapted to modify an operating recipe of the spacer etch tool based on the etch time.

7. The processing line of claim 1, wherein the automatic process controller is adapted to determine an overetch time based on the measured thickness of the insulative layer.

8. The processing line of claim 7, wherein the spacer etch tool is adapted to receive an endpoint signal, the automatic process controller is adapted to modify an operating recipe of the spacer etch tool based on the overetch time, and the spacer etch tool is adapted to overetch the insulative layer based on the overetch time after receiving the endpoint signal.

9. The processing line of claim 1, wherein the automatic process controller is a stand-alone controller.

10. The processing line of claim 1, wherein the automatic process controller is resident on at least one of the a thickness metrology tool and the spacer etch tool.

11. The processing line of claim 1, wherein the automatic process controller comprises a plurality of computers.

* * * * *